United States Patent
Zhang

(10) Patent No.: US 7,266,018 B2
(45) Date of Patent: Sep. 4, 2007

(54) REDUCING SNEAK CURRENTS IN VIRTUAL GROUND MEMORY ARRAYS

(75) Inventor: Ruili Zhang, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 11/103,064

(22) Filed: Apr. 11, 2005

(65) Prior Publication Data

US 2006/0227616 A1 Oct. 12, 2006

(51) Int. Cl.
G11C 11/34 (2006.01)

(52) U.S. Cl. ............................. 365/185.29; 365/230.06

(58) Field of Classification Search ........... 365/185.29, 365/230.06
See application file for complete search history.

(56) References Cited

U.S. PATENT DOCUMENTS

| | | | | |
|---|---|---|---|---|
| 5,070,329 A | * | 12/1991 | Jasinaki | 340/7.27 |
| 5,901,090 A | * | 5/1999 | Haddad et al. | 365/185.29 |
| 6,819,591 B1 | * | 11/2004 | Kurihara et al. | 365/185.09 |
| 2003/0112056 A1 | * | 6/2003 | Tanzawa et al. | 327/536 |
| 2003/0161184 A1 | * | 8/2003 | Lee et al. | 365/185.3 |
| 2004/0232470 A1 | * | 11/2004 | Zheng et al. | 257/311 |

OTHER PUBLICATIONS

U.S. Appl. No. 11/167,354, filed Jun. 27, 2005, Ruili Zhang et al., *Reducing Sneak Currents In Virtual Ground Memory Arrays*.

* cited by examiner

*Primary Examiner*—Michael T Tran
(74) *Attorney, Agent, or Firm*—Trop, Pruner & Hu, P.C.

(57) ABSTRACT

Sneak currents may be reduced between adjacent input/output groups in addressed memory arrays, even in the case when I/O breaks are ineffective, such as during erase verify. By providing a plurality of intervening, appropriately biased, non-addressed memory cells, a high resistance to sneak currents may be presented.

17 Claims, 4 Drawing Sheets

REDUCING SNEAK CURRENTS IN VIRTUAL GROUND MEMORY ARRAYS

BACKGROUND

This invention relates generally to sensing virtual ground flash memory arrays.

In virtual ground flash memory arrays, sneak currents may occur during sensing. One way to reduce sneak currents is to provide a so-called input/output (I/O) break. The I/O break may be a column of programmed cells. This column of programmed cells is positioned between two adjacent input/output groups. Each input/output group may be coupled to a different sense amplifier so that it is possible to sense cells within different groups at the same time.

A problem with the programmed cell I/O break occurs with erase verify. In erase verify it is desirable to verify, after erasing a block in the array, that the block was actually erased. To do so, the cells are read after the erase to verify that they are in the right state. However, when the block is erased, the cells in the I/O break are also erased and, therefore, they can not act as I/O break any more. The array left in this state will cause sneak currents during the erase verify cycle.

Thus, there is a need for ways to reduce sneak currents, especially during the erase verify cycle.

DETAILED DESCRIPTION

Figure 1:
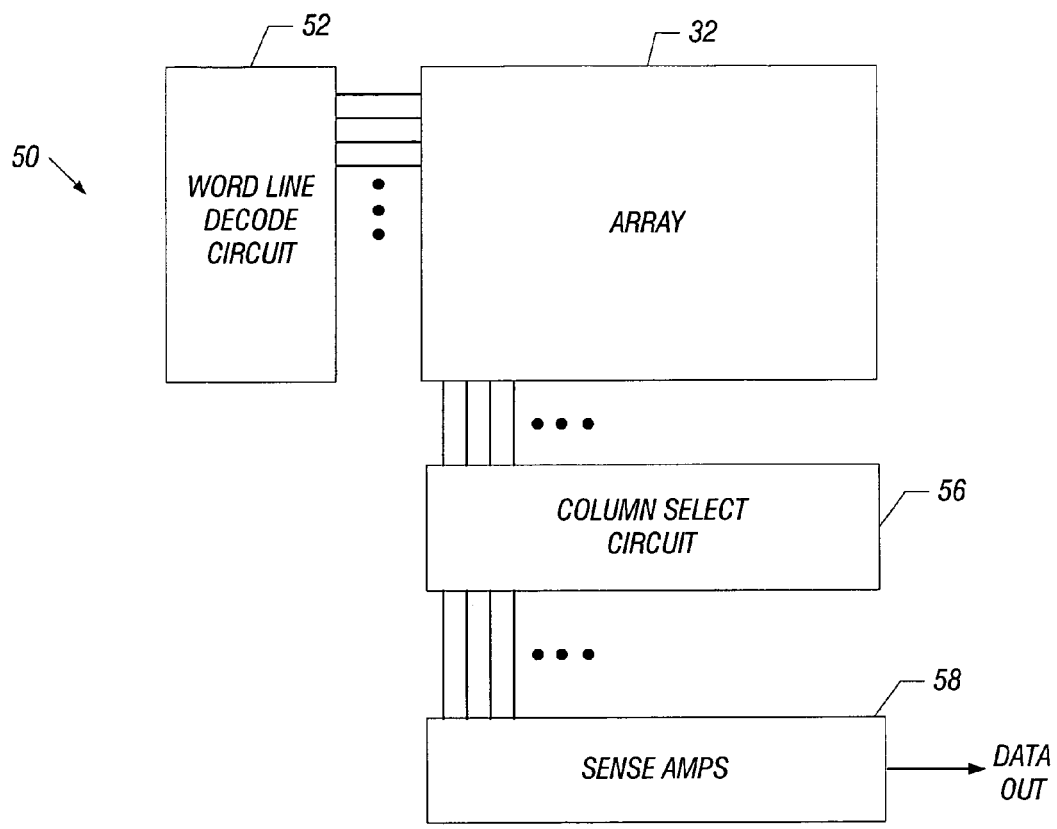
FIG. 1 is a schematic depiction of one embodiment of the present invention.

Referring to FIG. 1, a flash memory 50 may include an array 32 which uses a virtual ground arrangement. The array 32 may be addressed by a word line decode circuit 52 and a column select circuit 56. The column select circuit may be coupled to the sense amplifiers 58 which provide output data.

Figure 2:
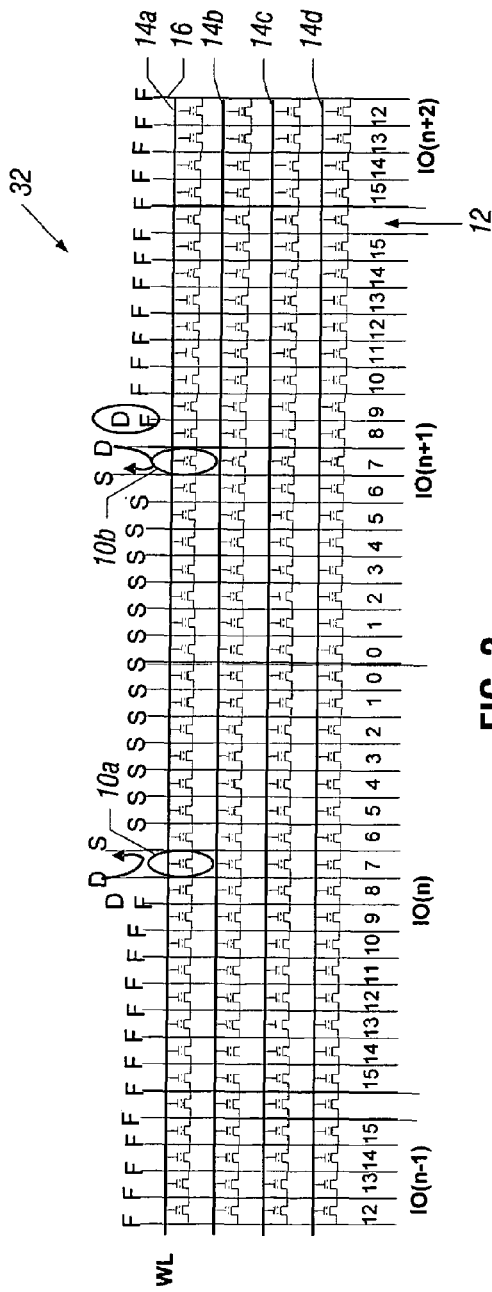
FIG. 2 is a depiction of an array when cells 7 in I/O(n) and I/O(n+1) are being sensed in an arrangement with an I/O break.

The array 32 may include I/O breaks or not. As shown in FIG. 2, an I/O break 12 may be included, in one embodiment, and an I/O break may be omitted in the embodiment shown in FIG. 4.

Referring to FIG. 2, the array 32 may include a polysilicon word line (WL) 14a which is strapped by a metal word line. High voltage is applied to the word line 14a to turn on a selected cell. Word lines 14b,14c,14d are biased at ground or negative voltage to shut off all the connected cells on those word lines. Since there are generally no contacts at either drain or source, the bit lines 16 are formed by the diffusions. Then, the diffusion bit lines 16 are strapped by a metal bit line to reduce the resistance. In some embodiments, the density of the bit line straps can be 32 rows per strap or 16 rows/strap. One I/O may contain 16 bit lines or 32 bit lines.

Likewise, a plurality of bit lines 16 may extend vertically in FIG. 2. Each of the bit lines 16 may be coupled to a y select transistor (not shown) at the bottom of the bit line 16. A metal 3 or third metal line (not shown) may be coupled to each of the bit lines 16 below the y select transistor. Most of the y select transistors of any I/O group may be coupled to a bit line diffusion which is strapped to a metal 2 bit line in some embodiments of the present invention.

When the word line 14a is activated to select cells along that word line, such as a pair of cells 7 in FIG. 2, a cell 10a (cell number 7) in I/O(n+1) and a cell 10b (also cell number 7) in I/O(n) are both selected. In each I/O, 16 cells are depicted, numbered 0-15, at the bottom. Cells 0 in adjacent I/Os are adjacent one another and cells 15 are spaced most far apart between two adjacent I/Os.

When doing an erase verify, despite the presence of the I/O break 12 made up of programmed cells, sneak currents may still occur because the I/O break 12 cells got erased during the erase cycle. Therefore, the array 32 may be biased to provide a series of relatively high resistance memory cells which effectively block sneak currents.

To this end, in the example of FIG. 2, when one of the cells in a first group composed of cells 0-7 is being sensed, the intervening cells between the sensed cells in group I/O(n+1) and group I/O(n) provide such a high resistance sneak current blocking path. The deselected cells in word lines, other than the word line 14a in this example, may be unbiased.

Thus, in FIG. 2, the cells outside the address group of cells at positions 0-7 may be all biased to have their bit lines float, as indicated by the letter "F," at the top of the bit lines 16. The cell at position 8 may, alternatively, be subjected to a higher drain bias in some embodiments because it is a cell immediately adjacent the selected cell at position 7. The selected cell at position 7 receives drain bias on one side of the cell and source bias on the other side, as indicated by the letters "D" and "S". The curved arrow implies current flowing direction in association with the cells at position 7. Thus, the cells at position 7 may be erase verified. However, ground bias is provided by biasing all of the intervening cells 8-15 with floating bias on both the drain and source sides of those cells.

For example, the word line 14a bias may be about 2.8 volts and 70 percent of the cells may have a threshold voltage greater than 2 volts. If the source bias is about 1 volt and the drain bias is higher, the intervening cells 0-6 and I/O(n) and I/O(n+1) provide an effective sneak current blocking resistance.

Figure 3:
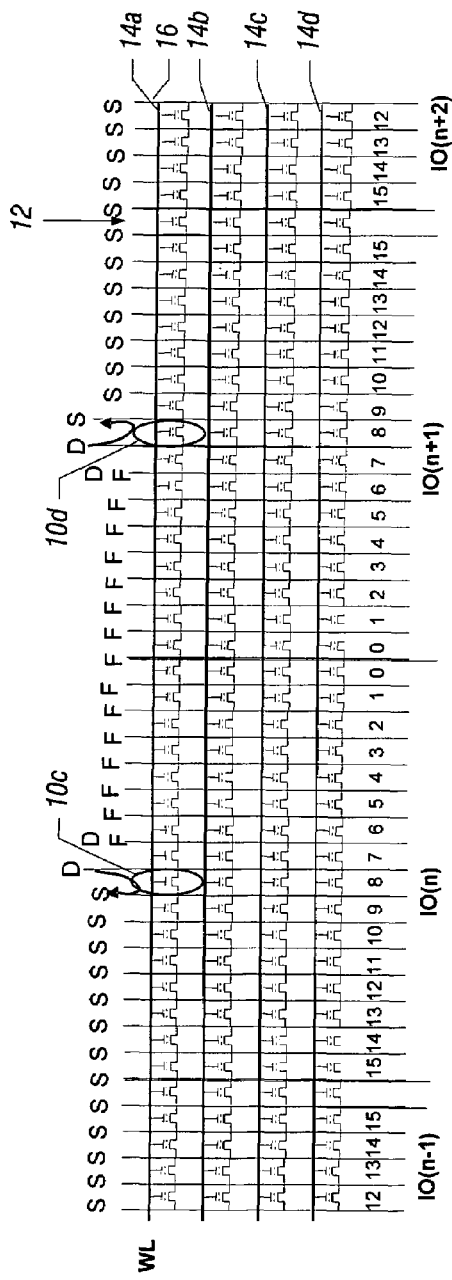
FIG. 3 corresponds to FIG. 2 but in the situation when cells 8 of I/O(n) and I/O(n+1) are being sensed.

Referring to FIG. 3, in this case, cells at position 8 of I/O(n) and I/O(n+1) are being sensed as indicated by the drain bias on one side of the cell 10d and the source bias on the other side of the cell 10d at position number 8 and a similar situation with respect to the cell 10c. In this case, the intervening cells are all floating and the cells outside the selected cells have the source bias on their sources and drains. Thus, the cells outside the selected group of cells, with the source bias, provide the ground source bias, for example, between I/O(n+1) and I/O(n+2) and, likewise, between I/O(n) and I/O(n−1).

Figure 4:
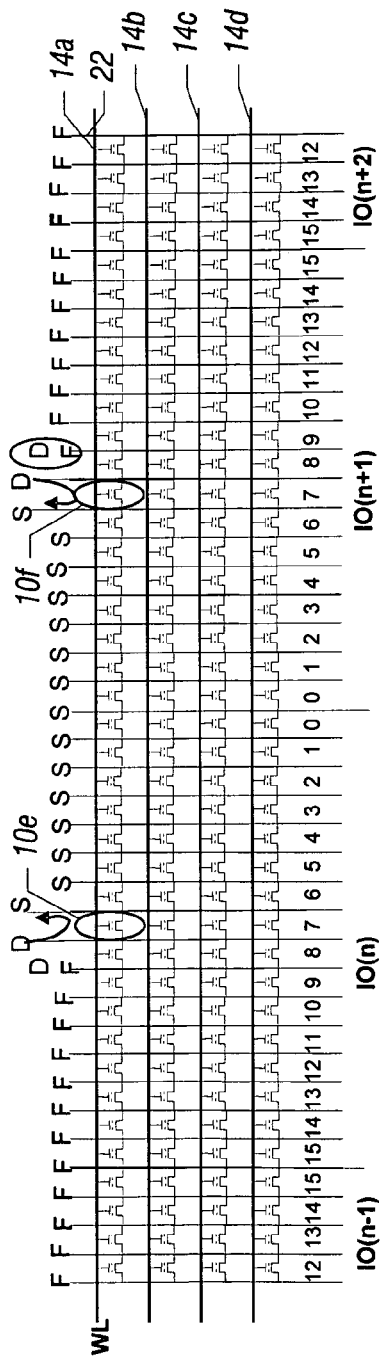
FIG. 4 is a depiction of an array without I/O break when cells 7 is being sensed in I/O(n) and I/O(n+1)
Figure 5:
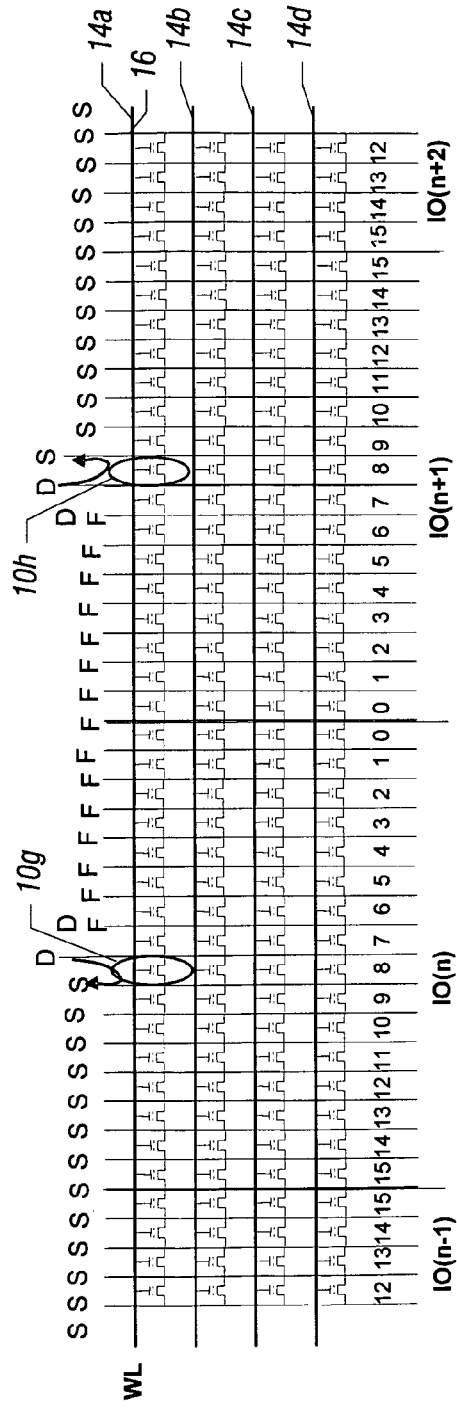
FIG. 5 is a depiction of the array of FIG. 4 when cells 8 in I/O(n) and I/O(n+1) are being sensed.

Referring to FIGS. 4 and 5, virtually the same arrangement can be implemented for the cells 10e and 10f with no I/O break. The non-selected cells, in the rows other than the word line 14a labeled WL, have ground or negative bias applied to their word lines.

Figure 6:
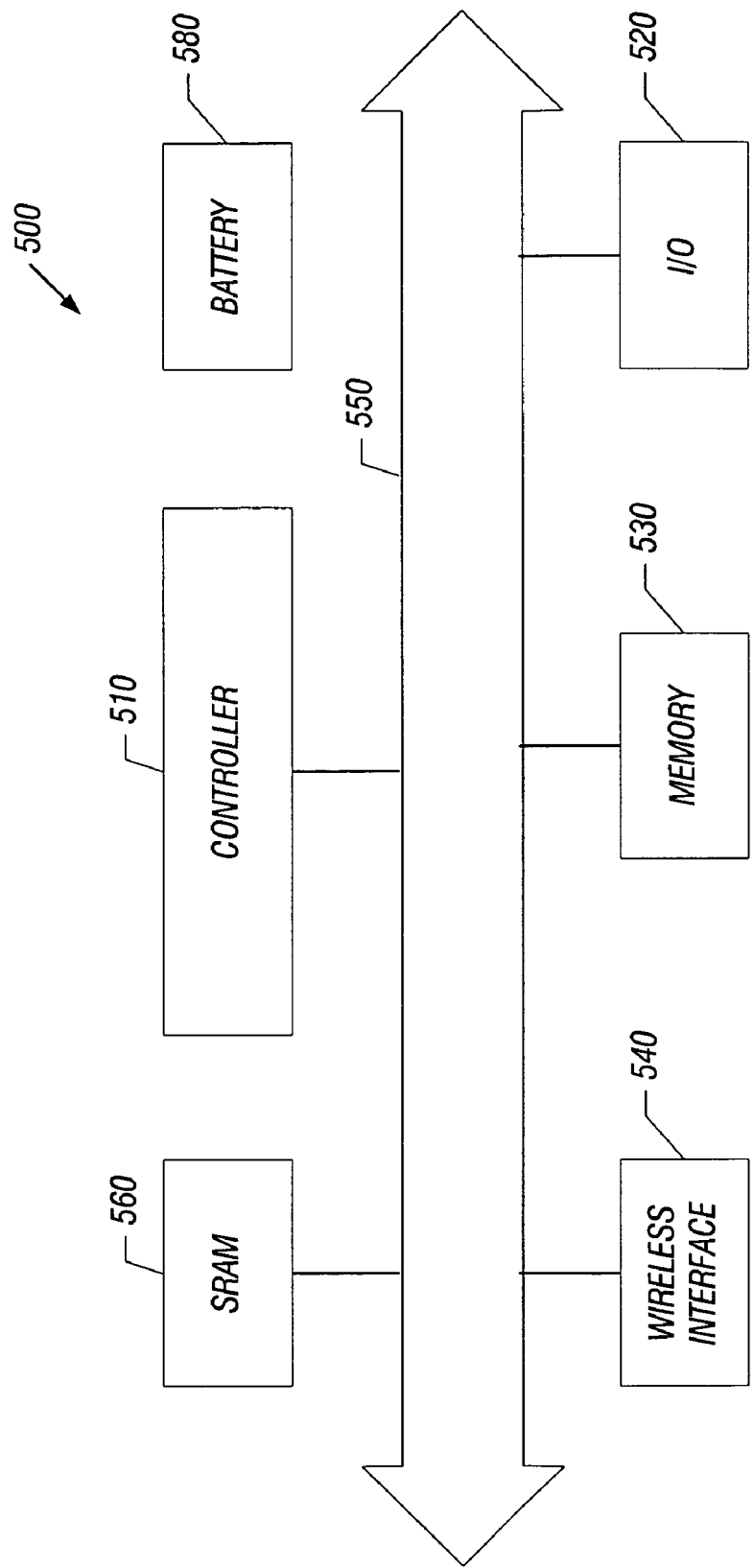
FIG. 6 is a depiction of a system using the memory of FIG. 1 in accordance with one embodiment of the present invention.

Referring to FIG. 6, in accordance with some embodiments of the present invention, a processor-based system 500 may be a personal computer, a laptop computer, a personal digital assistant, a cellular telephone, a digital camera, an entertainment system, a media player, or any of a variety of other processor-based systems. It may include a memory 530, which may be implemented by the memory 50, in some embodiments. It may also include a controller 510, which may be, for example, a microprocessor, multiple microprocessors, a digital signal processor, or a microcontroller, to mention a few examples. Coupling the controller 510 and the memory 530 may be a bus 550. The bus 550 may also be coupled to other memories, such as a static random access memory (SRAM) 560, an input/output device 520, and a wireless interface 540. The wireless interface 540 may be any system which enables wireless communications, including cellular wireless communications and networked wireless communications, to mention a few examples. The I/O device 520 may be any conventional I/O device including, among others, a display, a mouse, a keyboard, or the like.

Thus, in some embodiments, wireless communications may be implemented by the system 500 in which messages stored in the memory 530 may be communicated over the wireless interface 540. As one example, the wireless interface 540 may be a dipole antenna. Battery power 580 may be supplied in some embodiments, although the present invention is not limited to wireless applications or to battery powered applications.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   selecting two or more input/output groups for erase verify at the same time;
   selecting a corresponding cell in each group for erase verify;
   biasing a memory array during erase verify to provide a plurality of series connected cells which present resistance to sneak currents; and
   biasing the cells between the addressed cells with a source bias.

2. The method of claim 1 including providing a memory array with an input/output break.

3. The method of claim 1 including providing a memory array without an input/output break.

4. The method of claim 1 including providing at least 16 cells per group.

5. The method of claim 1 including biasing the cells outside the group of the two selected cells to be floating.

6. The method of claim 5 including providing a drain bias to one side of a selected cell and a source bias to the other side of said selected cell.

7. The method of claim 6 including biasing a word line with a selected cell and leaving unselected word lines unbiased.

8. A semiconductor memory comprising:
   an array of memory cells;
   a first pair of two input/output groups arranged side by side;
   a second pair of two input/output groups arranged on either side of said first two groups;
   a controller to bias the array during erase verify to provide a plurality of series connected cells between selected cells in said first pair of input/output groups, said controller to select a cell in the same position in each of said first pair of input/output groups at the same time for erase verify; and
   selecting a cell at the same position in each group of said first pair for erase verify.

9. The memory of claim 8 including an input/output break.

10. The memory of claim 8 without an input/output break.

11. The memory of claim 8 including sixteen cells per group.

12. The memory of claim 11, said controller to bias the cells between the addressed cells with a source bias.

13. The memory of claim 12, said controller to float the cells outside the first groups.

14. The memory of claim 13, said controller to drain bias one side of a selected cell and source bias the other side of a selected cell.

15. The memory of claim 14 including a plurality of word lines, each word line including a plurality of memory cells, said controller to bias a selected word line and leave unselected word lines unbiased.

16. A system comprising:
   a controller;
   a semiconductor memory including an input/output break and an array of memory cells including a first pair of input/output groups arranged side by side and a controller to bias the array during erase verify to provide a plurality of series connected cells between selected cells in each group of said first pair of input/output groups, said controller to bias the sources and drains of the plurality of series connected cells to have source bias, wherein the selected cells have a drain bias and a source bias and cells outside said first pair of input/output groups being provided with a floating bias on their sources and drains; and
   a wireless interface coupled to said controller.

17. The system of claim 16 wherein said wireless interface includes a dipole antenna.

* * * * *